United States Patent

Taguchi et al.

[11] Patent Number: 5,848,044
[45] Date of Patent: Dec. 8, 1998

[54] SEMICONDUCTOR LASER DRIVING CIRCUIT, SEMICONDUCTOR LASER DEVICE, IMAGE RECORDING APPARATUS, AND OPTICAL DISK APPARATUS

[75] Inventors: Toyoki Taguchi, Yokohama; Masayuki Tazawa, Yokosuka, both of Japan

[73] Assignee: Kabushiki Kaisha Toshiba, Kawasaki, Japan

[21] Appl. No.: 698,067

[22] Filed: Aug. 15, 1996

[30] Foreign Application Priority Data

Aug. 18, 1995 [JP] Japan .................................... 7-210714

[51] Int. Cl.⁶ ........................................................ G11B 7/00
[52] U.S. Cl. ................................................. 369/116; 369/54
[58] Field of Search ................................ 369/54, 58, 124, 369/116, 53; 372/31, 38, 25, 29, 26

[56] References Cited

U.S. PATENT DOCUMENTS 4,701,609 10/1987 Koishi et al. .................... 369/116 X
4,754,460 6/1988 Kimura et al. .................... 369/116 X
4,791,632 12/1988 Anderson et al. .

FOREIGN PATENT DOCUMENTS 0 082 357 6/1983 European Pat. Off. .
0 249 295 12/1987 European Pat. Off. .
0 309 791 4/1989 European Pat. Off. .

*Primary Examiner*—Paul W. Huber
*Attorney, Agent, or Firm*—Oblon, Spivak, McClelland, Maier & Neustadt, P.C.

[57] ABSTRACT

There is provided a semiconductor laser driving circuit. The circuit has: an amplifier for receiving an emission level setting voltage, and outputting a first driving signal on the basis of the emission level setting voltage; a driving signal generation circuit for receiving a control signal for instructing a light-emission period of a semiconductor laser, and the first driving signal output from said amplifier, and outputting a second driving signal corresponding to a level of the first driving signal in accordance with a light-emission or extinction period; a driving circuit for receiving the second driving signal output from said driving signal generation circuit, and generating and outputting a driving current to be supplied to the semiconductor laser; and a control circuit for receiving the emission level setting voltage, and adjusting a level of the second driving signal during the extinction period in correspondence with the emission level setting voltage.

6 Claims, 9 Drawing Sheets

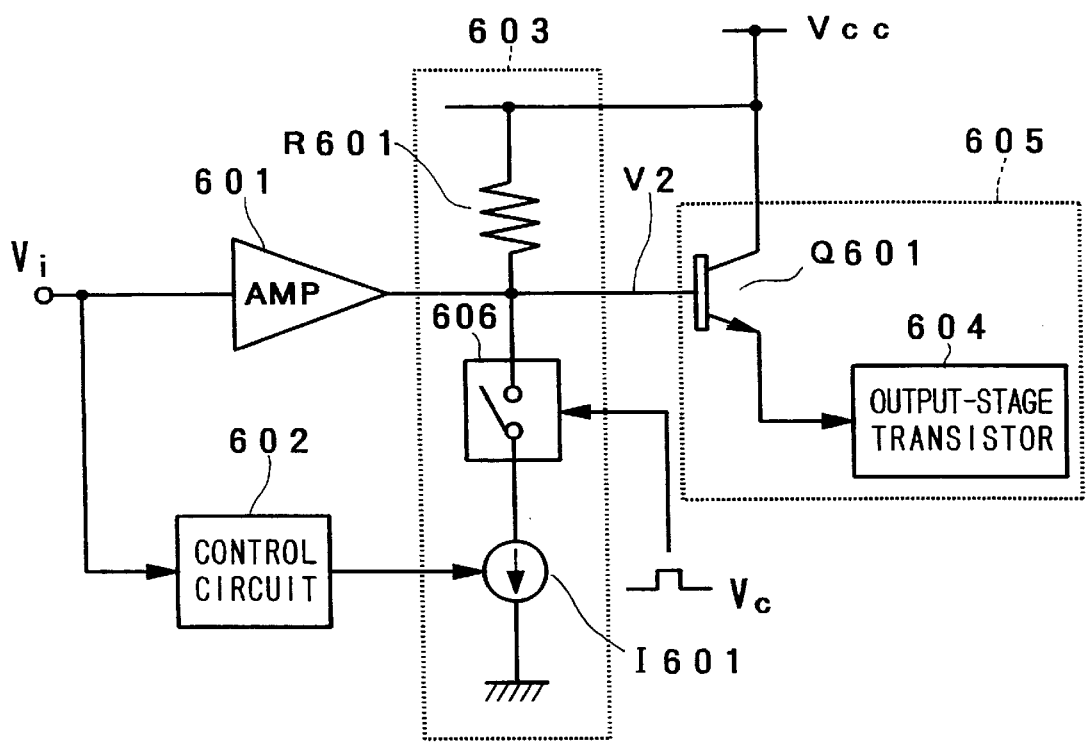
F I G. 1

SEMICONDUCTOR LASER DRIVING CIRCUIT, SEMICONDUCTOR LASER DEVICE, IMAGE RECORDING APPARATUS, AND OPTICAL DISK APPARATUS

BACKGROUND OF THE INVENTION

The present invention relates to a semiconductor laser driving circuit which can be used in an optical disk apparatus, a laser beam printer, a copying machine, an optical data communication system, various measuring device, or the like, an optical disk apparatus and an image recording apparatus using the semiconductor laser driving circuit.

A semiconductor laser has many features: easy modulation of light-emission power by control of the driving current, a compact structure, small consumption power, and high electro-photo conversion efficiency. For this reason, the semiconductor laser is popularly used in an optical disk apparatus and an image recording apparatus such as a laser printer, a copying machine, or the like. However, the semiconductor laser has the following characteristics:

(1) The differential quantum efficiency changes due to changes in temperature and aging.

(2) The threshold value of the laser driving current changes due to changes in temperature and reflected light.

(3) Mode hopping noise is generated due to reflected light.

The amount of light emitted by the semiconductor laser varies due to these characteristics. In view of this problem, a circuit for controlling to maintain a constant amount of light by monitoring the amount of output light from the semiconductor laser is used. For example, a conventional control circuit disclosed in Japanese Patent Laid-Open No. 4-208581 is known. In this circuit, light output from a semiconductor laser is received by a photodetector serving as a light-receiving element to be converted into a light-receiving current proportional to the light emission amount, and the light-receiving current is negatively fed back to detect any error from a light-emission power command signal using an error detection circuit. Then, the driving current of the semiconductor laser is controlled so that the error is assumed to be zero. In addition to such feedback control system, the control circuit also comprises a compensation circuit for negatively feeding back a compensation current to the input of the error detection circuit so as to compensate for a phase lag of the feedback control loop.

An image recording apparatus such as a laser printer is required to have a high extinction ratio indicating the ON/OFF ratio of light. However, the feedback efficiency considerably lowers and control can hardly be made in the OFF region of the semiconductor laser, i.e., in the neighborhood of the threshold value or less upon oscillation of the laser. For this reason, the conventional semiconductor laser device suffers a decrease in extinction ratio and a light-emission delay.

SUMMARY OF THE INVENTION

The present invention has been made in consideration of the above situation, and has as its object to provide a semiconductor laser driving circuit which can prevent any light-emission delay or a semiconductor laser driving circuit which can obtain a high extinction ratio while preventing any light-emission delay, and an optical disk apparatus which has good high-frequency characteristics and can attain low power dissipation using the semiconductor laser driving circuit, or an image recording apparatus which can obtain high image quality using the semiconductor laser driving circuit.

A semiconductor laser driving circuit of the present invention comprises an amplifier for receiving an emission level setting voltage, and outputting a first driving signal on the basis of the emission level setting voltage, a driving signal generation circuit for receiving a control signal for instructing a light-emission period of a semiconductor laser, and the first driving signal output from the amplifier, and outputting a second driving signal corresponding to a level of the first driving signal in accordance with a light-emission or extinction period, a driving circuit for receiving the second driving signal output from the driving signal generation circuit, and generating and outputting a driving current to be supplied to the semiconductor laser, and a control circuit for receiving the emission level setting voltage, and adjusting a level of the second driving signal during the extinction period in correspondence with the emission level setting voltage.

The driving signal generation circuit may comprise a switch which is turned off during the light-emission period of the semiconductor laser and is turned on during the extinction period of the semiconductor laser, and a constant current source for generating the second driving signal by extracting a current corresponding to the first driving signal under the control of the control circuit during the extinction period of the semiconductor laser.

The driving signal generation circuit of the present invention comprises a differential amplifier for receiving complementary emission level setting voltages, and outputting a first driving signal and an inverted first driving signal, which are complementary signals, on the basis of the emission level setting voltages, a driving signal generation circuit for receiving the first driving signal output from the amplifier, and complementary control signals for instructing a light-emission period of a semiconductor laser, and outputting a second driving signal which has a level substantially equal to a level of the first driving signal during the light-emission period instructed by the control signal, and has a level obtained by decreasing the level of the first driving signal during an extinction period, a driving circuit for receiving the second driving signal, and generating and outputting a driving current to be supplied to the semiconductor laser, and a control circuit for receiving the emission level setting voltage or the inverted first driving signal output from the amplifier, and controlling the level of the first driving signal to be decreased by the driving signal generation circuit during the extinction period.

The semiconductor laser driving circuit may have the following arrangement. That is, the amplifier comprises a series circuit of a first resistor, a first transistor, and a first constant current source, which circuit is connected between a power supply voltage terminal and a ground terminal, and another series circuit of a second resistor, a second transistor, and a second constant current source, which circuit is connected in parallel with the former series circuit and between the power supply voltage terminal and the ground terminal, bases of the first and second transistors respectively receive the complementary emission level setting voltages, the first driving signal based on the emission level setting voltage is output from one terminal of the second transistor, and the inverted first driving signal complementary to the first driving signal is output from one terminal of the first transistor, the driving signal generation circuit comprises a series circuit of a third transistor and a third constant current source connected between the power supply voltage terminal and the ground terminal, and a fourth transistor connected between the one terminal of the second transistor and a connection node between the third transistor and the third constant current source, bases of the third and fourth transistors respectively receive the complementary control signals for instructing the light-emission period of the semiconductor laser, one terminal of the fourth transistor receives the first driving signal output from the second transistor, and the second driving signal having a level equal to the level of the first driving signal during the light-emission period is output from the one terminal of the fourth transistor, the driving circuit comprises a fifth transistor, two terminals of which are connected between the power supply voltage terminal and an output terminal, and a base of which receives the second driving signal output from the driving signal generation circuit, and an output-stage transistor for outputting the driving current to be supplied to the semiconductor laser on the basis of a signal output from one terminal of the fifth transistor, and the control circuit comprises a series circuit of a resistor, a sixth transistor, and a fourth constant current source, which circuit is connected between the power supply voltage terminal and the ground terminal, and a current-voltage conversion circuit which is connected between the power supply voltage terminal and the ground terminal, an input terminal of which is connected to a connection node between the sixth transistor and the fourth constant current source, and an output terminal of which is connected to a control terminal of the third constant current source, a base of the sixth transistor receives the emission level setting voltage or the inverted first driving signal, and the current-voltage conversion circuit outputs a signal for controlling a current amount of the third constant current source during the extinction period.

The control circuit may adjust the level of the second driving signal, so that a voltage equal to or in the vicinity of an operation threshold value voltage is applied across a base-emitter path of the output-stage transistor included in the driving circuit.

A semiconductor laser device of the present invention comprises a semiconductor laser for outputting a laser beam in accordance with a supplied driving current, a photodetector for detecting the laser beam output from the semiconductor laser and outputting a detection signal, a control amplifier for receiving the detection signal output from the photodetector and a control signal for instructing a light-emission period of the semiconductor laser, and generating and outputting complementary control error signals, the amplifier, the driving signal generation circuit, the driving circuit, the control circuit, a sample-hold circuit for receiving the control error signal or the inverted first driving signal, and the control signal, holding a level of the control error signal or the inverted first driving signal during the light-emission period, and outputting the held level during the extinction period, and a comparator for receiving and comparing the control error signal or the inverted first driving signal, and the level output from the sample-hold circuit, and supplying a comparison result to the control amplifier during the extinction period so as to adjust the level of the control error signal output from the control amplifier during the extinction period on the basis of the level of the control error signal or the inverted first driving signal during the light-emission period.

Another semiconductor laser device of the present invention comprises the semiconductor, the photodetector, the control amplifier, an oscillator for outputting a control signal for instructing a light-emission period of the semiconductor laser, the amplifier, the driving signal generation circuit, the driving circuit, and the control circuit.

Still another semiconductor laser device of the present invention comprises a semiconductor laser for outputting a laser beam in accordance with a supplied driving current, a photodetector for detecting the laser beam output from the semiconductor laser and outputting a detection signal, a control amplifier for receiving the detection signal output from the photodetector and a control signal for instructing a light-emission period of the semiconductor laser, and generating and outputting a control error signal, a first driving signal generation circuit for receiving the control error signal, and generating and outputting a monitor signal and a first driving signal, a second driving signal generation circuit for receiving the control signal and the first driving signal, and outputting, as a second driving signal, a signal obtained by decreasing a level of the first driving signal output from the first driving signal generation circuit, so that the driving current to be supplied to the semiconductor laser becomes substantially zero during an extinction period, a level shift circuit for receiving the second driving signal output from the second driving signal generation circuit, level-shifting the second driving signal, and outputting the level-shifted signal as a third driving signal, a driving circuit for receiving the third driving signal output from the level shift circuit, and outputting the driving current to be supplied to the semiconductor laser, a sample-hold circuit for receiving the control signal and the monitor signal, holding a level of the monitor signal during the light-emission period, and outputting the held level during the extinction period, a first control circuit for adjusting the level of the first driving signal to be decreased by the second driving signal generation circuit during the extinction period on the basis of the level output from the sample-hold circuit, a comparison amplifier for receiving and comparing the level output from the sample-hold circuit and the monitor signal, and supplying a comparison result to the control amplifier during the extinction period, so that the control amplifier controls to maintain a level of the control error signal to be output during the extinction period to be a level of the control error signal to be output during the light-emission period, and a second control circuit for controlling the level shift circuit so as to compensate for a change in third driving signal output from the level shift circuit due to a change in temperature.

The semiconductor laser may have the following arrangement. That is, the control amplifier outputs the control error signal as differential outputs, the first driving signal generation circuit comprises a first transistor, a collector of which is connected to a power supply voltage terminal via a first resistor, a base of which receives one of the control error signals, and an emitter of which is connected to one terminal of a current source, and a second transistor, a collector of which is connected to the power supply voltage terminal via a second resistor, a base of which receives the other control error signal, and an emitter of which is connected to one terminal of the current source, generates the monitor signal from the collector of the first transistor, and generates the first driving signal from the collector of the second transistor, the semiconductor laser device further comprise an amplifier for receiving the control signal, and outputting the control signal as differential outputs, and the second driving signal generation circuit comprises a third transistor, a collector of which is connected to the collector of the second transistor, a base of which receives one of the control signals, and an emitter of which is connected current source, an a variable current source, and a fourth transistor, a collector of which is connected to the power supply voltage terminal, a base of which receives the other control signal, and an emitter of which is connected to one terminal of the variable current source, and an output current from the variable current source is controlled by the first control circuit.

The level shift circuit may comprise a fifth transistor, a base of which is connected to the collector of the third transistor, a collector of which is connected to the power supply voltage terminal, and an emitter of which is connected to the variable current source via a third resistor, and the output current of the variable current source may be controlled by the second control circuit, so as to prevent a variation in level of the third driving signal output from a connection node between the third resistor and the variable current source due to a change in temperature.

The sample-hold circuit may have an input terminal which is connected to the collector of the first transistor of the first driving signal generation circuit and receives the monitor signal, and a control terminal which receives the control signal, and holds and outputs the level of the monitor signal during the extinction period on the basis of the control signal, and the comparator may comprise a comparison amplifier for receiving and comparing the level output from the sample-hold circuit and the monitor signal output from the first driving signal generation circuit, and outputting the comparison result, and a switch circuit, two terminals of which are connected between an output terminal of the comparison amplifier and an input terminal of the control amplifier, and a control terminal of which receives the control signal, the switch circuit supplying the comparison result output from the comparison amplifier to the control amplifier during the extinction period on the basis of the control signal.

An image recording apparatus of the present invention comprises the semiconductor laser device, a control signal generation circuit for supplying the control signal to the semiconductor laser device so that the laser beam is output from the semiconductor laser device, scanning means for scanning the laser beam output from the semiconductor laser device onto a surface of a photosensitive body upon reception of the control signal, and forming a latent image, and an image generation unit for visualizing the latent image formed on the photosensitive body by the scanning means.

An optical disk apparatus of the present invention comprises the semiconductor laser device, an oscillator for supplying the control signal to the semiconductor laser device so that the laser beam is output from the semiconductor laser device, light irradiation and reception means for irradiating the laser beam output from the semiconductor laser device onto a surface of an optical disk upon reception of the control signal, receiving the laser beam reflected by the surface of the optical disk, and outputting a photodetection signal, and reproduction information signal output means for outputting a reproduction information signal for reproducing information written in the optical disk upon reception of the photodetection signal output from the light irradiation and reception means.

BRIEF DESCRIPTION OF THE DRAWINGS

FIG. 1 is a circuit diagram showing the arrangement of a semiconductor laser driving circuit according to the first embodiment of the present invention;

DESCRIPTION OF THE PREFERRED EMBODIMENTS

The preferred embodiments of the present invention will be described hereinafter with reference to the accompanying drawings.

Figure 9:
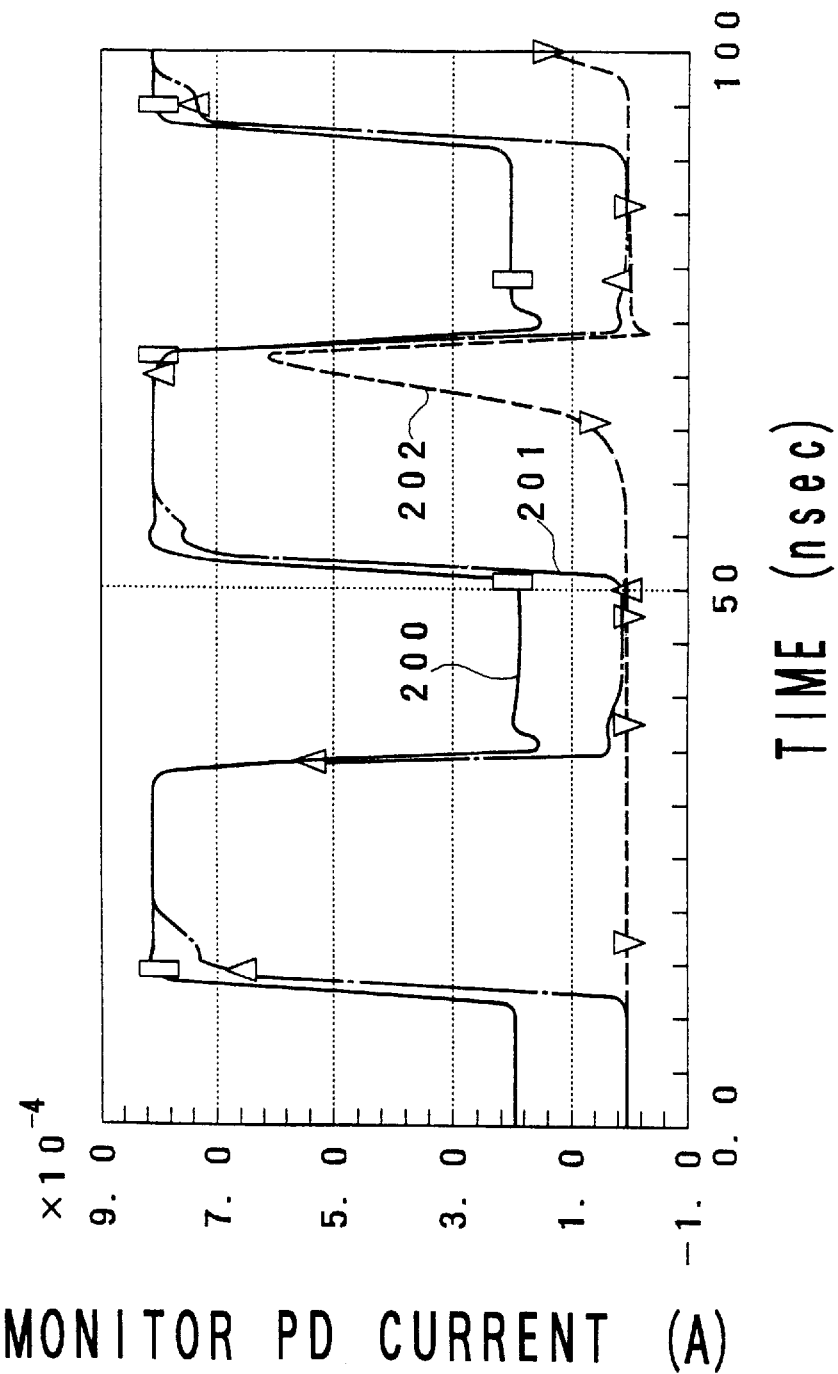
FIG. 9 is a timing chart showing the waveform of the driving current in a conventional semiconductor laser device.

Prior to the description of the embodiments of the present invention, FIG. 9 shows the results of simulation of the response waveforms of the monitor current output from a light detector comprising a photodetector (PD) upon turning on/off a conventional semiconductor laser device. When the driving current is not set to be completely "0" but a constant current is supplied during the extinction period in which the semiconductor laser does not emit light, good pulse characteristics can be obtained, as indicated by a response waveform 200, although the extinction ratio lowers. In contrast to this, when the driving current is set to be completely "0", the waveform cannot have a sharp leading edge, the feedback efficiency lowers, and sufficient OFF characteristics cannot be obtained, as indicated by a response waveform 201. In addition, a light-emission delay occurs. In order to improve the OFF characteristics, when a control signal is set at negative level in the extinction state to attain deep modulation, the waveform in the ON state deteriorates, as indicated by a response waveform 202, resulting in an unstable control operation. When control indicated by the response waveform 201 or 202 is made, a light-emission delay occurs, and the edge of the printed image is blurred or shifted in, e.g., a laser printer.

In the embodiment of the present invention, the final output-stage transistor in a driving circuit for generating a driving current is controlled not to be completely turned off during the extinction period in which the semiconductor laser does not emit light, on the basis of the above-mentioned simulation results. More specifically, a voltage equal to in the vicinity of the operation threshold value voltage is applied across the base-emitter path of an output-stage transistor, which generates a driving current to be supplied to a semiconductor laser, during the extinction period of the semiconductor laser, thereby maintaining a constant driving current and preventing a light-emission delay. Furthermore, not only prevention of such light-emission delay, but also the extinction ratio is improved by setting the driving current to be supplied to a semiconductor laser during the extinction period to be substantially "0".

FIG. 1 shows the arrangement of a semiconductor laser driving circuit according to the first embodiment of the present invention.

The semiconductor laser driving circuit comprises an amplifier 601, a control circuit 602, a driving signal generation circuit 603, and a driving circuit 605 having an npn bipolar transistor 0601 and an output-stage transistor 604.

The amplifier 601 receives and amplifies an emission level setting voltage indicating the level upon light emission of a semiconductor laser (not shown), and outputs a driving signal.

The driving signal generation circuit 603 has a resistor R601, a switch circuit 606, and a variable current source I601, which are connected in series with each other between a power supply voltage Vcc terminal and a ground terminal. The switch circuit 606 receives a control signal Vc for defining the light-emission and extinction timings of the semiconductor laser, and opens/closes the path between the connection node between the output terminal of the amplifier 601 and the input terminal of the driving circuit 605, and the variable current source I601. The current amount of the variable current source I601 is controlled by the control circuit 602 (to be described later).

The driving circuit 605 comprises the npn bipolar transistor Q601, the collector is connected to the power supply voltage Vcc terminal, the emitter is connected to the output-stage transistor 604, and the base is connected to the output terminal of the driving signal generation circuit 603.

The driving signal generation circuit 603 generates a driving signal which has substantially the same level as that of the emission level setting voltage amplified by the amplifier 601 during the light-emission period and changes to low level during the extinction period, on the basis of a control signal indicating the light-emission or extinction period of the semiconductor laser, and supplies the driving signal to the base of the transistor Q601 in the driving circuit 605. Upon reception of this driving signal, the transistor Q601 controls the driving operation of the output-stage transistor 604. With this control, the output-stage transistor 604 outputs a driving current during the light-emission period, and supplies it to the semiconductor laser.

Furthermore, upon reception of the emission level setting voltage Vc, the control circuit 602 controls the current amount of the variable current source I601 on the basis of the received emission level setting voltage Vc.

If the output-stage transistor 604 is completely turned off during the extinction period, the rising timing of the operation upon switching to the light-emission period is delayed, resulting in a light-emission delay, as described above. In view of this problem, in order to prevent the output-stage transistor 604 from being completely turned off during the extinction period, i.e., to apply a voltage equal to in the vicinity of the operation threshold value voltage across the base-emitter path, the current amount of the variable current source I601 is controlled to control the base potential of the transistor Q601.

When the emission level setting voltage vc is large, the current amount is set to be large since the base potential of the transistor Q601 must be lowered more largely during the extinction period. On the contrary, when the emission level setting voltage Vc is small, the current amount is set to be small so as to prevent the base potential of the transistor Q601 from being excessively lowered during the extinction period. With this control, a constant voltage equal to or in the vicinity of the operation threshold value can be applied across the base-emitter path of the output-stage transistor 604 during the extinction period independently of the light emission level, thereby preventing any light-emission delay.

Figure 2:
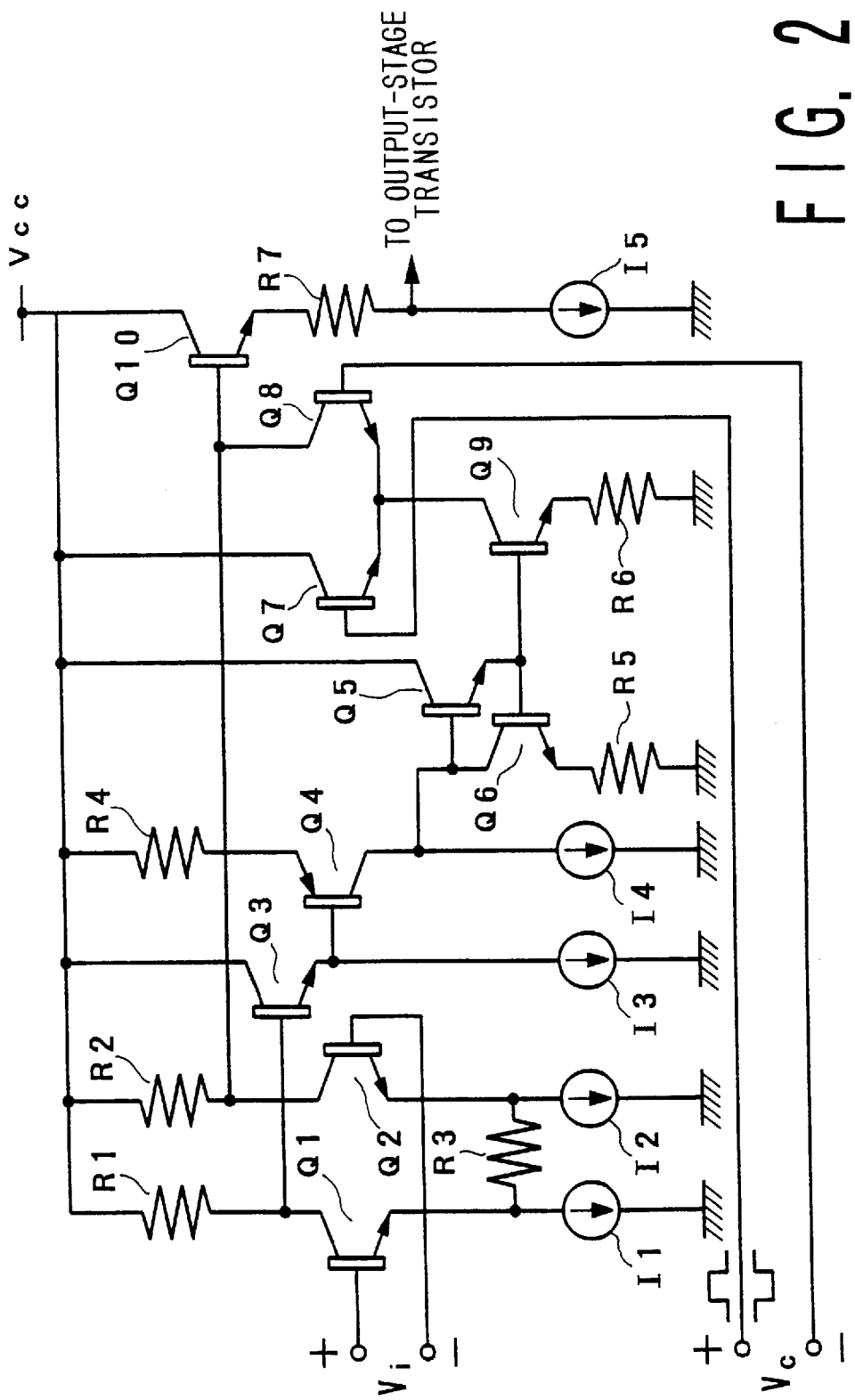
FIG. 2 is a circuit diagram showing the arrangement of a semiconductor laser driving circuit according to the second embodiment of the present invention.

FIG. 2 shows a semiconductor laser driving circuit according to the second embodiment of the present invention. In association with the first embodiment, the amplifier 601 corresponds to resistors R1, R2, and R3, npn bipolar transistors Q1 and Q2, and constant current sources I1 and I2, and an npn bipolar transistor Q3 corresponds to a buffer for amplifying the output from the amplifier 601. The control circuit 602 corresponds to resistors R4 and R5, a pnp bipolar transistor Q4, constant current sources I3 and I4, and npn bipolar transistors Q5 and Q6, and the driving signal generation circuit 603 corresponds to npn bipolar transistors Q7 to Q9, and a resistor R6. An npn bipolar transistor Q10, a resistor R7, a constant current source I5, and an output-stage transistor (not shown) correspond to the driving circuit 605.

The bases of the transistors Q1 and Q2 receive complementary emission level setting voltages Vi. These voltages Vi are relatively considered as a constant DC voltage having a predetermined level. When the voltage Vi is high, the transistor Q1 is turned on, and the transistor Q2 is turned off, so that a voltage V2 output from the collector of the transistor Q2 becomes higher than a voltage Vi output from the collector of the transistor Q1. As the voltage Vi becomes higher, the voltage V2 increases, and the voltage V1 complementarily decreases.

The voltage V2 is input to the collector of the transistor Q8. The bases of the transistors Q7 and Q8 receive complementary pulses Vc for instructing light-emission or extinction of the semiconductor laser. With these pulses, the transistor Q8 is turned off and the transistor Q7 is turned on during the light-emission period of the semiconductor laser. On the other hand, during the extinction period, the transistor Q8 is turned on to decrease the base potential of the transistor Q10 and to turn it off, and the transistor Q7 is turned off. In this manner, the base potential of the transistor Q10 changes between the voltage V2 and low level in correspondence with the light-emission or extinction timing of the semiconductor laser.

During the ON period of the transistor Q10, the voltage V2 is level-shifted by a voltage drop component across the two terminals of the resistor R7, and the level-shifted voltage is supplied to the output-stage transistor at the output side. Then, a driving current is supplied to the semiconductor laser, thus emitting light. When the transistor Q10 is turned off, supply of the driving current is stopped, and the semiconductor laser stops light emission.

During the extinction period of the semiconductor laser, a low-level voltage is input to the base of the transistor Q10. In this case, if this level is too low, the final output-stage transistor for outputting a driving current is completely turned off, and the rising timing upon switching to the light-emission period is delayed, as described above. Thus, the base potential of the transistor Q10 is controlled so that a voltage equal to in the vicinity of the operation threshold value voltage is applied across the base-emitter path of the output-stage transistor during the extinction period. This control is attained by adjusting the base potential of the transistor Q9, which lowers the emitter potential of the transistor Q8, using the voltage V1 output from the collector of the transistor Q1.

The voltage V2 output from the collector of the transistor Q2 is input to the base of the transistor Q10 in a state wherein it is changed in a pulse shape by the transistor Q8, as described above. Then, the voltage V1 which has a complementary relationship with the voltage V2 and characteristics as a DC voltage is used. The voltage V1 is input to the base of the transistor Q3 which serves as a buffer, a voltage substantially equal to the voltage V1 is output from the emitter, and the output voltage is input to the base of the transistor Q4. The transistor Q4 has a polarity different from those of other transistors Q1 to Q3 and Q5 to Q10, i.e., is of pnp type. For this reason, a voltage substantially equal to the voltage V1 appears at the emitter side of the transistor Q4, and an emitter current is input to a current/voltage converter constituted by the transistors Q5 and 06, and the resistor R5. As a result, a voltage corresponding to the emitter current is input to the base of the transistor Q9. With this voltage, the ON resistance of the transistor Q9 is controlled, thereby controlling the drop amount of the base potential of the transistor Q10 by the transistor Q8 during the extinction period.

More specifically, when the emission level setting voltage Vi is high (i.e., the driving current to be supplied to the semiconductor laser is large), the voltage V1 decreases, and its polarity is inverted by the transistor Q4. As a result, the base potential of the transistor Q9 rises, and the amount of current which is supplied to the transistors Q8 and Q9 to drop the base potential of the transistor Q10 during the extinction period increases. Conversely, when the emission level setting voltage Vi is low (the driving current to be supplied to the semiconductor laser is small), the voltage V1 increases, and its polarity is inverted by the transistor Q4. As a result, the base potential of the transistor Q4 falls, and the amount of current which is supplied to the transistors Q8 and Q9 to drop the base potential of the transistor Q10 during the extinction period decreases. In this manner, the base potential of the transistor Q10 during the extinction period is adjusted in correspondence with the emission level of the semiconductor laser during the light-emission period, and the control is made to always apply a voltage in the vicinity of a constant operation threshold value voltage across the base-emitter path of the output-stage transistor, thereby preventing any light-emission delay.

Figure 3:
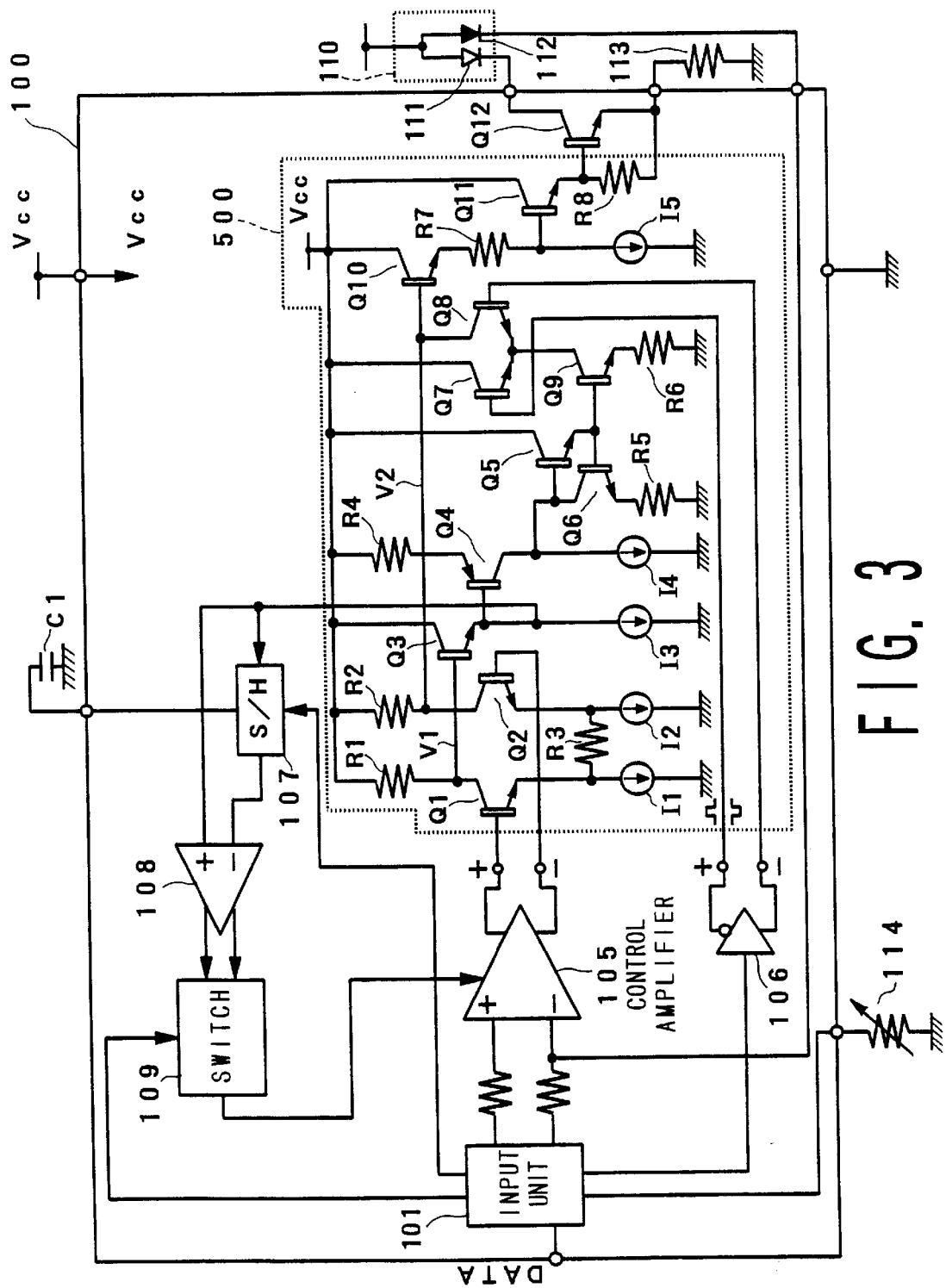
FIG. 3 is a circuit diagram showing the arrangement is of a semiconductor laser device for a laser beam printer apparatus according to the third embodiment of the present invention.

FIG. 3 shows the arrangement of a semiconductor laser device according to the third embodiment, which is adopted to apply the semiconductor laser driving circuit according to the second embodiment to a laser beam printer apparatus.

A semiconductor laser driving circuit 500 enclosed in a dotted line comprises the same arrangement as that of the second embodiment described above In addition to the semiconductor laser driving circuit 500, the semiconductor laser device of this embodiment comprises an input unit 101, a control amplifier 105, a differential output buffer 106, a sample-hold circuit 107, a comparison amplifier 108, a switch circuit 109, an output-stage transistor Q12, an external capacitor C1, resistors 102, 103, and 113, a rheostat 114, and a semiconductor laser circuit 110 having a semiconductor laser 111 and a photodetector 112.

A light-emission/extinction signal (DATA) for instructing light-emission or extinction of the semiconductor laser 111 is input to the input unit 101. The input unit 101 performs level conversion or the like with a corresponding external circuit, and outputs the light-emission/extinction signal to the sample-hold circuit 107 and the differential output buffer 106.

The differential output buffer 106 outputs a complementary light-emission/extinction signal, which is input to the bases of transistors Q7 and Q8.

Furthermore, the input unit 101 generates a binary control signal for instructing light-emission and extinction levels and a reference signal, which are respectively input to the inverting and non-inverting input terminals of the control amplifier 105 via the resistors 103 and 102. Note that the control signal can be adjusted by the rheostat 114 connected between one terminal of the resistor 103 and the inverting input terminal of the control amplifier 105.

The control amplifier 105 receives a comparison result signal output from the switch circuit 109 (to be described later) in addition to the control signal and the reference signal. The control amplifier 105 generates a control error signal which corresponds to the difference between the reference signal and the control signal, and also corresponds to the light-emission level during the light-emission period indicated by the comparison result signal, and inputs it to the bases of transistors Q1 and Q2 as differential outputs.

In the second embodiment, the bases of the transistors Q1 and Q2 receive an emission level setting signal. This signal always has a constant value. In contrast to this, in this embodiment, the value of the control error signal input to the bases of the transistors Q1 and Q2 is controlled in correspondence with the light-emission amount during the light-emission period.

The sample-hold circuit 107 receives the light-emission/ extinction signal output from the input unit 101, and a voltage substantially equal to a voltage V1 output from the emitter of a transistor Q3, i.e., a voltage indicating the light-emission level during the light-emission period. In response to these signals, the sample-hold circuit 107 holds the light-emission level during the light-emission period, and outputs the held level to the comparison amplifier 108. The comparison amplifier 108 receives the held level during the light-emission period, and the voltage substantially equal to the voltage V1 output from the emitter of the transistor Q3, comparison-amplifies low level during the extinction period and the held level during the light-emission period, and inputs a comparison result signal to the switch circuit 109. The switch circuit 109 outputs the comparison result signal to the control amplifier 105 during the extinction period in response to the light-emission/extinction signal output from the input unit 101. The control amplifier 105 outputs a control error signal which is adjusted based on the light-emission amount during the light-emission period to the bases of the transistors Q1 and 02, thereby controlling the light-emission level.

Furthermore, the light-emission amount of the semiconductor laser 111 that emits light upon reception of a driving current is detected by the photodetector 112, and the detected signal is input to the inverting input terminal of the control amplifier 105. Hence, the control error signal output from the control amplifier 105 reflects the detected light-emission level, and the light-emission amount can be controlled to be kept at an optical level.

As described above, according to this embodiment, the base potential of a transistor Q10 is controlled so that the output-stage transistor Q12 is not completely turned off during the extinction period, as in the second embodiment, and feedback control can be attained on the basis of the signal (voltage V1) indicating the light-emission level during the light-emission period and the detected light-emission amount.

Figure 4:
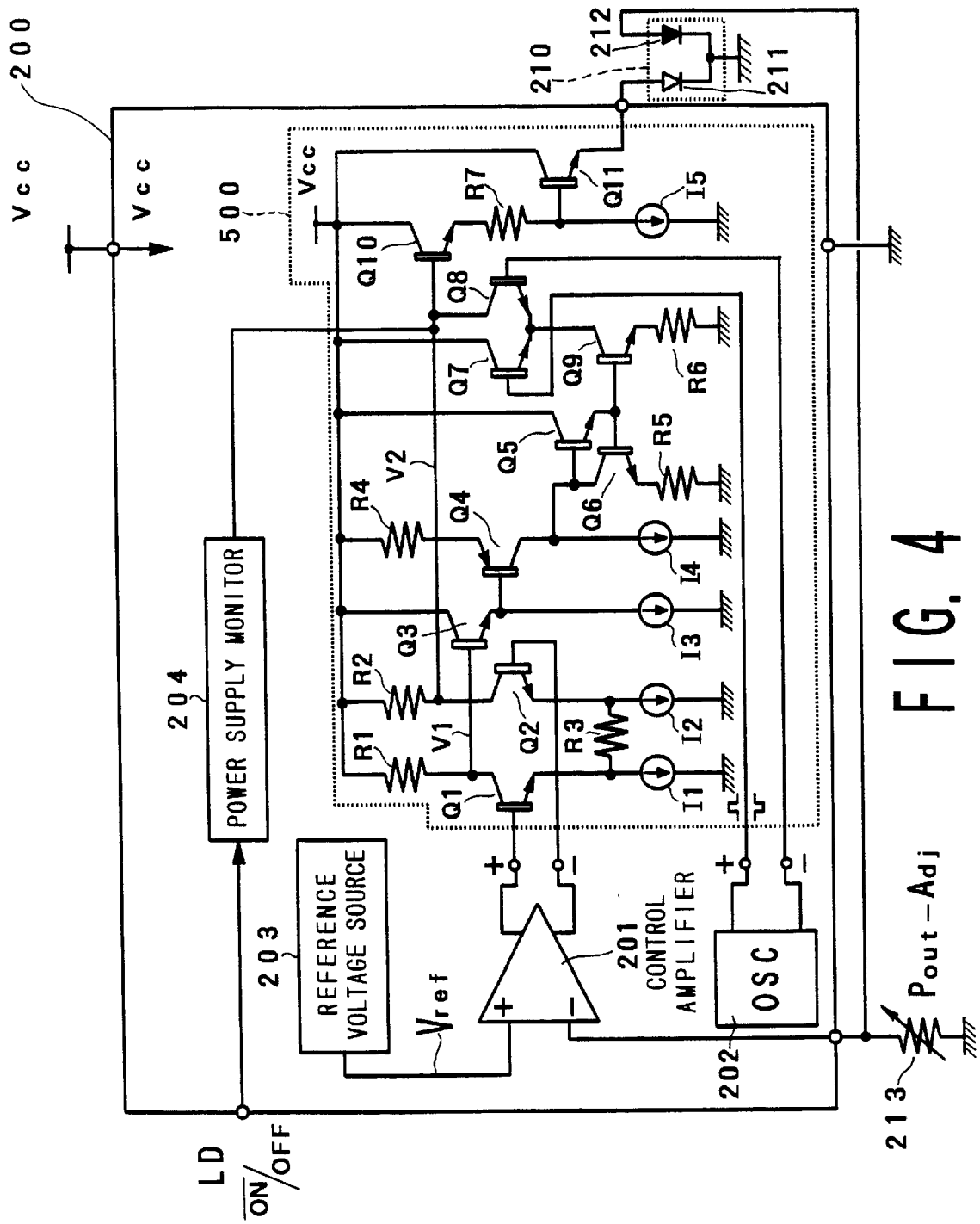
FIG. 4 is a circuit diagram showing the arrangement of a semiconductor laser device for a laser beam printer apparatus according to the fourth embodiment of the present invention.

FIG. 4 shows the arrangement of a semiconductor laser device according to the fourth embodiment of the present invention, which can be applied to an optical disk apparatus. The device of the fourth embodiment comprises a semiconductor laser driving circuit 500 according to the second embodiment, a control amplifier 201, an oscillator 202, a semiconductor laser circuit 210, a resistor 213, a reference voltage source 203, and a power supply monitor 204.

The bases of transistors Q7 and Q8 in the semiconductor laser driving circuit 500 receive complementary pulse signals output from the oscillator 202. The pulse signal is set at, e.g., a desired high frequency between 100 to 400 MHz.

The non-inverting and inverting input terminals of the control amplifier 201 respectively receive a reference voltage Vref output from the reference voltage source 203 and a light-emission amount detection signal output from a photodetector 212. The level of the light-emission amount detection signal can be adjusted by the rheostat 213. The control amplifier 201 generates a control error signal obtained by amplifying the difference between the reference voltage Vref and the light-emission amount detection signal, and inputs it to the bases of transistors Q1 and Q2 as differential outputs.

Furthermore, the power supply monitor 204 monitors a power supply voltage Vcc. When the power supply voltage Vcc becomes lower than a predetermined level due to some abnormality, the power supply monitor 204 forcibly lowers the base potential of a transistor Q7 to the ground level, thereby stopping supply of a driving current to a semiconductor laser 211.

According to this embodiment, since the semiconductor laser driving circuit according to the second embodiment is applied to a semiconductor laser driving unit in the optical disk apparatus, light-emission delays can be prevented, and even when the semiconductor laser is emission/extinction-controlled at a high frequency falling within the range from 100 to 400 MHz, good high-frequency characteristics can be obtained. Since the light-emission operation is ON/OFF-controlled at such high frequency, generation of laser noise can be suppressed. Furthermore, since the laser driving current becomes zero during the extinction period, the average driving current amount can be averaged, thus attaining low power dissipation.

Figure 5:
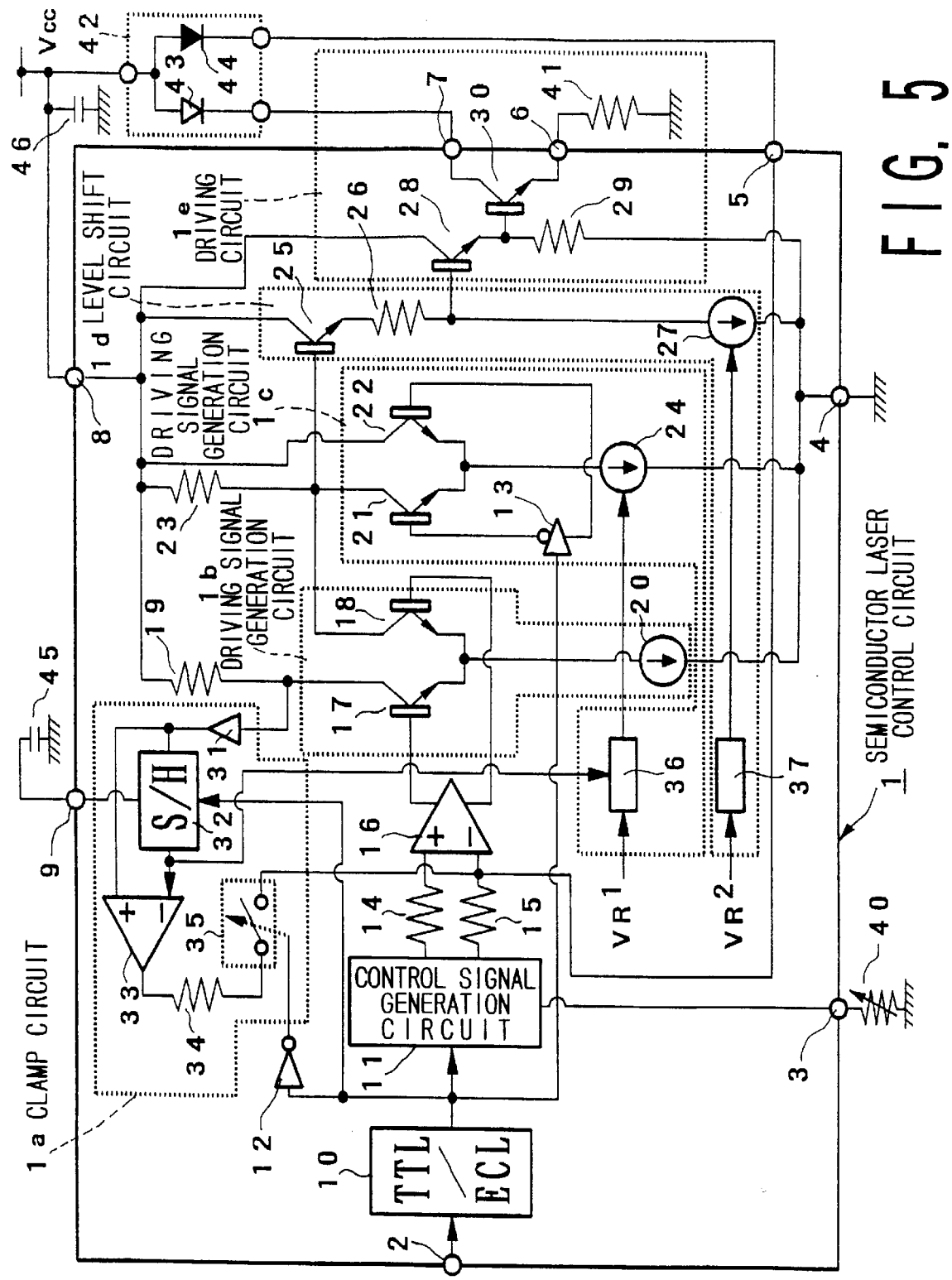
FIG. 5 is a circuit diagram showing the arrangement of a semiconductor laser device according to the fifth embodiment of the present invention.

FIG. 5 shows the arrangement of a semiconductor laser device according to the fifth embodiment of the present invention. The device of the fifth embodiment comprises a semiconductor laser control circuit 1 which is constituted by an integrated circuit and has terminals 2 to 9, a semiconductor laser circuit 42 which is connected to the semiconductor laser control circuit 1 and receives a driving current therefrom, and a rheostat 40, a resistor 41, and capacitors 45 and 46, which are externally connected to the semiconductor laser control circuit 1. The semiconductor laser circuit 42 comprises a semiconductor laser 43, and a photodetector 44 as a light-receiving diode that monitors output light from the semiconductor laser 43.

The operation of the circuit of this embodiment will be described below.

The input terminal 2 of the semiconductor laser control circuit 1 receives a TTL level binary signal that instructs light-emission and extinction from an external circuit. The TTL level binary signal is input to a TTL/ECL conversion circuit 10, and is converted into an ECL level binary signal to be used in the circuit of this embodiment. Then, the ECL level binary signal is output. The output ECL level binary signal is input, as a control signal, to an inverter 12, a sample-hold circuit 32, a control signal generation circuit 11, and a differential output buffer 13.

Upon reception of the control signal, the control signal generation circuit 11 generates a binary control signal for instructing light-emission and extinction levels and a reference signal, and supplies them to the inverting and non-inverting input terminals of a control amplifier 16 via resistors 15 and 14, respectively. Note that the level of the control signal output from the control signal generation circuit 11 can be adjusted by the rheostat 40 connected to the terminal 3 of the semiconductor control circuit 1, which is connected to the control terminal of the control signal generation circuit 11.

The inverting input terminal of the control amplifier 16 receives a sum of the control signal supplied via the resistor 15, as described above, a photodetection signal output from the photodetector 44 and supplied via the terminal 5 of the semiconductor laser control circuit 1, and a comparison result signal output from a clamp circuit 1a (to be described later). The control amplifier 16 generates a control error signal by amplifying an error corresponding to the difference between the sum signal supplied to the inverting input terminal and the reference signal supplied to the non-inverting input terminal, and outputs the generated signal as differential outputs, which are supplied to a driving signal generation circuit 1b (to be described below).

The driving signal generation circuit 1b constitutes a differential amplifier having an npn bipolar transistor 17, the collector of which is connected to a power supply voltage Vcc terminal via a resistor 19, and the base of which is connected to one output terminal of the control amplifier 16, an npn bipolar transistor 18, the collector of which is connected to the power supply voltage Vcc terminal via a resistor 23, and the base of which is connected to the other output terminal of the control amplifier 16, and a constant current source 19, the two terminals of which are connected between the emitters of the transistors 17 and 18 and the ground terminal.

Furthermore, a driving signal generation circuit 1c constitutes a differential amplifier having an npn bipolar transistor 21, the collector of which is connected to the power supply voltage Vcc terminal via the resistor 23, an npn bipolar transistor 22, the collector of which is connected to the power supply voltage Vcc terminal, a variable current source 24, the two terminals of which are connected between the emitters of the transistors 21 and 22 and the ground terminal, a current control circuit 36 for controlling the output current from the variable current source 24, and the differential output buffer 13, the output terminals of which are respectively connected to the bases of the transistors 21 and 22. The input terminal of the differential output buffer 13 is connected to the output terminal of the TTL/ECL conversion circuit 10.

The collector of the transistor 18 in the driving signal generation circuit 1b, and the collector of the transistor 21 in the driving signal generation circuit 1c are commonly connected to the base of an npn bipolar transistor in a level shift circuit 1d (to be described later).

The bases of the transistors 17 and 18 in the driving signal generation circuit 1b receive the control error signals output as the differential outputs from the control amplifier 16, and these signals are differentially amplified by these transistors. As a result, a feedback clamp monitor signal is generated from the collector terminal of the transistor 17, and a first driving signal is generated from the collector terminal of the transistor 18. At the same time, the binary signal output from the TTL/ECL conversion circuit 10 is supplied to the differential output buffer 13, and differentially amplified binary signals are respectively supplied to the bases of the transistors 21 and 22 of the driving signal generation circuit 1c as differential outputs. Thus, the transistor 21 whose collector is connected to that of the transistor 18, which outputs the first driving signal, operates to decrease the level of the first driving signal during the extinction period to a predetermined level. If the level to be decreased is too high, the driving current to be supplied to the semiconductor laser 43 does not consequently become substantially "0" during the extinction period, and the extinction ratio lowers. On the other hand, if the level is too low, a final-stage transistor 30 in a driving circuit 1e is completely set in the OFF state during the extinction period, thus causing a light-emission delay. For these reasons, the first driving signal must be decreased to an optimal level during the extinction period, and this level is adjusted by controlling the output current from the variable current source 24 on the basis of the output from the clamp circuit 1a by the current control circuit 36, as will be described later. As a result, a signal which has the same level as that of the first driving signal output from the driving signal generation circuit 1b during the light-emission period, and is decreased to the predetermined level by the driving circuit generation circuit 1c during the extinction period is output to the level shift circuit 1d as a second driving signal.

The level shift circuit 1d comprises an npn bipolar transistor 25, the collector of which is connected to the power supply voltage Vcc terminal, the base of which receives the second driving signal, and the emitter of which is connected to one terminal of a variable current source 27 via a resistor 26, and a current control circuit 37 for controlling the output current from the variable current source 27. When the above-mentioned second driving signal is input to the base of the transistor 25, a signal shifted to a predetermined level is generated from a node that connects one terminal of the resistor 26 and one terminal of the variable current source 27. The level to be shifted is determined by controlling the output current from the variable current source 27 under the control of the current control circuit 37, as will be described later.

The driving circuit 1e is connected to the node that connects the resistor 26 and the variable current source 27. The driving circuit 1e comprises an npn bipolar transistor 28, the collector of which is connected to the power supply voltage Vcc terminal, the base of which is connected to the emitter of the transistor 25 via the resistor 26, and the emitter of which is connected to the ground terminal via a resistor 29, and an npn bipolar transistor 30, the collector of which is connected to one terminal of the semiconductor laser 43, the base of which is connected to the emitter of the transistor 28, and the emitter of which is connected to the ground terminal via a resistor 41.

The second driving signal is shifted to the predetermined level by the level shift circuit 1d, and the level-shifted signal is supplied to the base of the transistor 28 in the driving circuit 1e as a third driving signal. The third driving signal is amplified by the transistors 28 and 30, which are Darlington-connected to each other, and a driving current based on the third driving signal is generated at the collector terminal of the transistor 30. The collector terminal of the transistor 30 is connected to the semiconductor laser 43 via the terminal 7, and the light-emission operation of the laser 43 is controlled by the generated driving current.

Furthermore, the clamp circuit 1a is connected to the collector terminal of the transistor 17 in the driving circuit generation circuit 1b. The clamp circuit 1a comprises a buffer 31, the input terminal of which is connected to the collector of the transistor 17, the sample-hold circuit 32, the input terminal of which is connected to the output terminal of the buffer 31 and the control terminal of which is connected to the output terminal of the TTL/ECL conversion circuit 10, a comparison amplifier 33, the inverting input terminal of which is connected to the output terminal of the buffer 31 and the non-inverting input terminal of which is connected to the output terminal of the sample-hold circuit 32, and an analog switch 35, one terminal of which is connected to the output terminal of the comparison amplifier 33 via a resistor 34, and the other terminal of which is connected to the output terminal of the differential amplifier 16. The open/close operation of the analog switch 35 is controlled by the binary signal output from the TTL/ECL conversion circuit 10 and amplified by the inverter 12.

The collector terminal of the transistor 17 in the driving signal generation circuit 1b generates a monitor signal having a phase opposite to that of the above-mentioned first driving signal generated from the collector terminal of the transistor 18. This monitor signal is amplified by the buffer 31 in the clamp circuit 1a, and the amplified monitor signal is supplied to the sample-hold circuit 32. The sample-hold circuit 32 samples and holds the level of the monitor signal during the light-emission period in accordance with the timing defined by the binary signal supplied from the TTL/ECL conversion circuit 10, and outputs the held level during the extinction period. The held level output from the sample-hold circuit 32 is supplied to the non-inverting terminal of the comparison amplifier 33 and the current control circuit 36.

The comparison amplifier 33 compares the held level of the monitor signal during the light-emission period, and the monitor signal output from the buffer 31, and outputs a comparison result. The output from the comparison amplifier 33 is input to the inverting input terminal of the differential amplifier 16 via the resistor 34 and the analog switch 35. The analog switch 35 is closed during the extinction period on the basis of the binary signal supplied from the TTL/ECL conversion circuit 10. As a result, during the extinction period, the first driving signal having a phase opposite to that of the monitor signal output from the driving signal generation circuit 1b is subjected to feedback clamp control so as to maintain the level during the light-emission period.

On the other hand, when the level held by the sample-hold circuit 32 is supplied to the current control circuit 36, this level is compared with an externally input reference potential VR1. The comparison result is supplied to the variable current source 24 in the driving signal generation circuit 1b, thus controlling the output current from the variable current source 24. As described above, the driving signal generation circuit 1c decreases the level of the first driving signal output from the driving signal generation circuit 1b to the predetermined level during the extinction period. This predetermined level must be set so that the transistor 30 can be prevented from being completely turned off due to too a low emitter potential of the transistor 28 in the driving circuit 1e to cause a light-emission delay, and that the driving current to be supplied to the semiconductor laser 43 can be prevented from becoming almost "0" during the extinction period due to too a high emitter potential. For this purpose, the level of the monitor signal during the light-emission period is held, and the output current from the variable current source 24 during the extinction period is controlled on the basis of the comparison result between the held level and the reference potential VR1. With this control, a high extinction ratio and prevention of a light-emission delay can be attained at the same time.

The current control circuit 37 is adopted to prevent variations in voltage across the base-emitter path of the transistor due to changes in temperature, which variations result in variations in driving current. Variations in base-emitter voltage of a transistor arranged in the current control circuit 37 due to changes in temperature are detected, and the current output from the variable current source 27 in the level shift circuit 1d is controlled on the basis of this detection result. With this control, the emitter potential of the transistor 25 in the level shift circuit 1d is controlled to be optimized, so as to consequently minimize any variations in driving current to be output from the driving circuit 1e.

Figure 6:
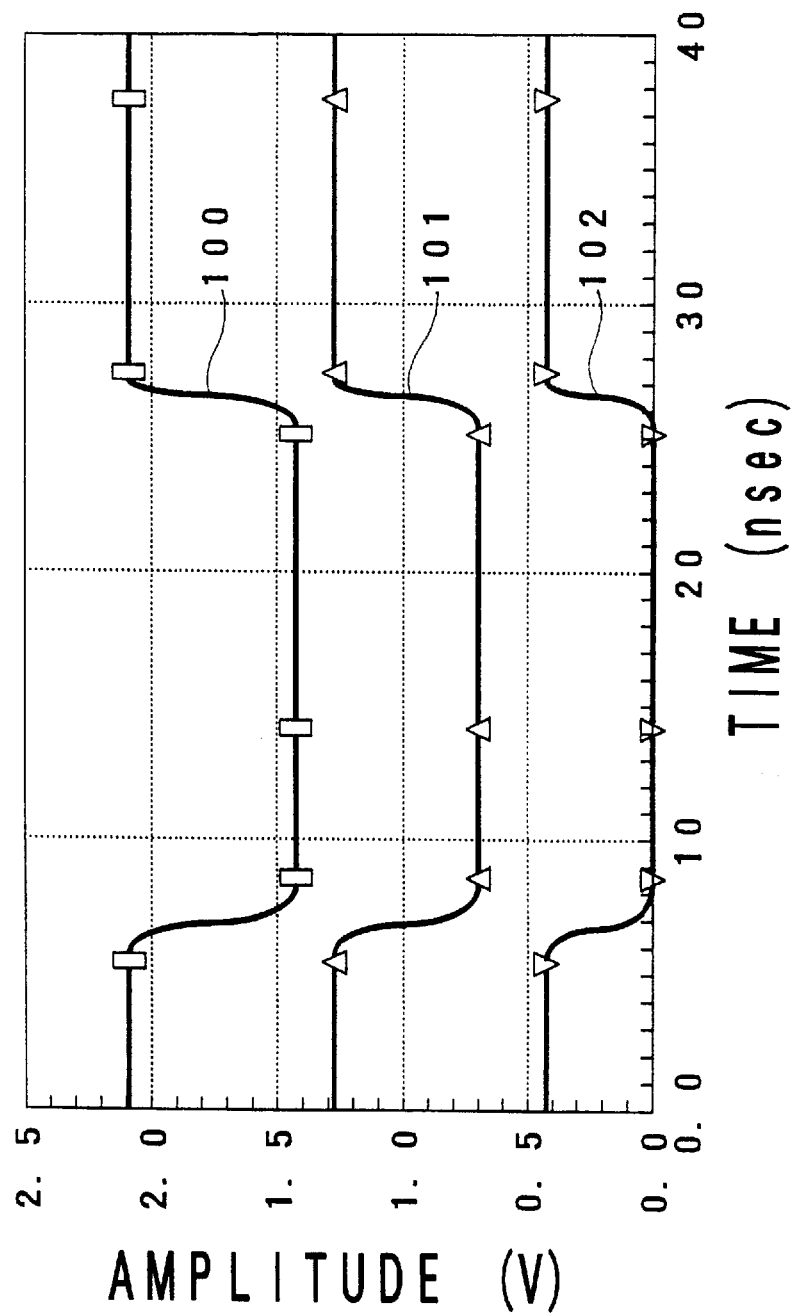
FIG. 6 is a timing chart showing the output waveforms of a level shift circuit and a driving circuit in the semiconductor laser device shown in FIG. 5.

FIG. 6 shows the results of simulation of the waveforms of signals during the light-emission and extinction periods in this embodiment. A waveform 100 represents the waveform of the third driving signal output from the emitter of the transistor 25 in the level shift circuit 1d, a waveform 101 represents the waveform of the signal output from the emitter of the first-stage transistor 28 in the driving circuit 1e, and a waveform 102 represents the voltage level of the signal output from the emitter of the second-stage transistor 30 in the driving circuit 1e via the terminal 6. Referring to FIG. 6, at start time 0, the semiconductor laser 43 is in the light-emission period, all the transistors 25, 28, and 30 are ON, and the output levels of these transistors are kept constant. When the semiconductor laser 43 enters the extinction period after an elapse of about 5.5 nsec, the second driving signal whose level is decreased is output from the driving signal generation circuit 1c. However, as described above, the current control circuit 36 controls the current output from the variable current source 24 to a predetermined level, so that the level of the second driving signal is not decreased too much. With this control, the emitter potential of the transistor 25 that receives the second driving signal does not become "0", as indicated by the waveform 100, the first-stage transistor 28 in the driving circuit 1e is not completely turned off, as indicated by the waveform 101, and the emitter potential of the transistor 28 maintains about 0.7 V even during the extinction period.

The output signal from the emitter of the transistor 28 is supplied to the emitter of the second-stage transistor 30 in the driving circuit 1e. In this case, when the output signal from the transistor 28 has completely "0" level during the extinction period, the rising timing of the output signal from the final-stage transistor 30 upon light emission is delayed. However, as described above, since a signal having a level of about 0.7 V is input to the base of the transistor 30 even during the extinction period, as indicated by the waveform 101, the operation delay of the transistor 30 is prevented. As a result, the emitter potential at the beginning of the light-emission period, i.e., the driving current to be supplied to the semiconductor laser 43 can have a sharp leading edge, thus preventing any light-emission delay.

Furthermore, the levels, during the extinction period, of the first driving signal and the monitor signal output from the driving signal generation circuit 1b are held at the same level as that during the light-emission period by the feedback clamp operation, as described above. For this reason, the levels of the waveforms 100 to 102 at the beginning of the light-emission period after an elapse of about 26 nsec in FIG. 6 matches those after an elapse of 0 sec in FIG. 6. In this manner, the levels can be prevented from varying at the beginning of the light-emission period, and a constant light-emission intensity can be maintained with high precision.

Even when the base-emitter potential of each transistor varies due to changes in temperature, such variations are absorbed by the current control of the variable current source 27 by the current control circuit 37 in the level shift circuit 1d, thus stabilizing the circuit operation.

Since the level of the second driving signal supplied to the base of the transistor 25 in the level shift circuit 1d is controlled so that the driving current during the extinction period becomes substantially "0", as described above, a high extinction ratio can be obtained.

Figure 7:
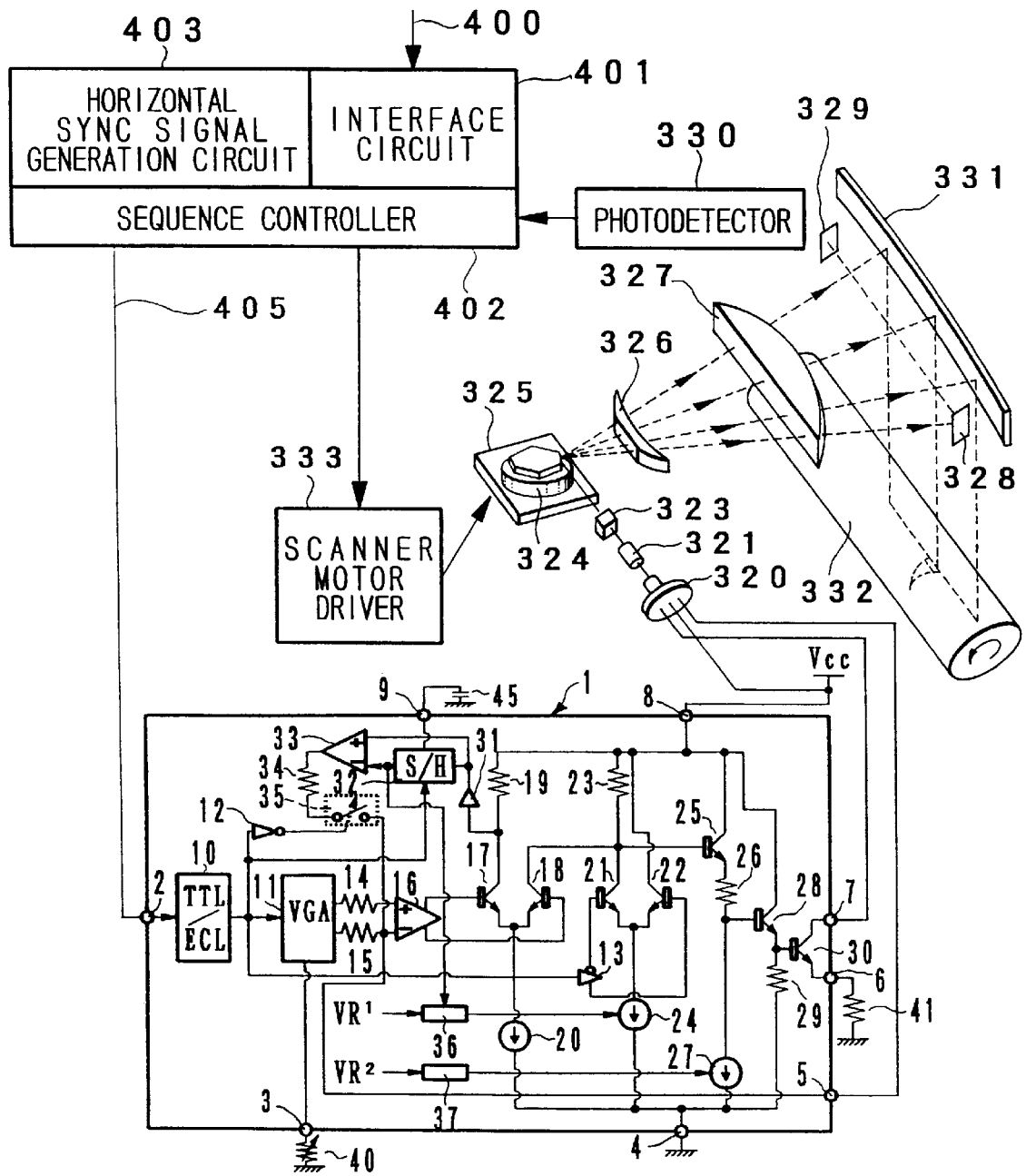
FIG. 7 is a circuit diagram showing the arrangement of an image storage apparatus according to the sixth embodiment of the present invention.

An image recording apparatus according to the sixth embodiment of the present invention, which uses the semiconductor laser device according to the fifth embodiment, will be described below with reference to FIG. 7. In FIG. 7, a semiconductor laser control circuit 1, a rheostat 40, a resistor 41, and a capacitor 45 are the same as those shown in FIG. 5.

A video signal 400 is output from an image control apparatus (not shown), and is supplied to an interface circuit 401. The video signal 400 is supplied from the interface circuit 401 to a sequence controller 402, which, in turn, supplies a video signal 405 as the above-mentioned TTL level binary signal to an input terminal 2 of the semiconductor laser control circuit 1. When the video signal 405 is input to the semiconductor laser control circuit 1, a semiconductor laser incorporated in a semiconductor laser device 320 is ON/OFF-controlled on the basis of the input video signal while realizing a high extinction ratio and prevention of a light-emission delay, as described above. A laser beam output from the semiconductor laser is transmitted through a cylindrical lens 323 via a collimator lens 321, and is irradiated onto a polygonal mirror 324. The polygonal mirror 324 is rotated at a constant velocity by a motor 325, and the irradiated laser beam is transmitted through a coupling lens 327 via a toric lens 326. The laser beam is then reflected by a mirror 331. The laser beam reflected by the mirror 331 scans the surface of a photosensitive drum 332, thereby forming a latent image.

The photosensitive drum 332 is rotated at a constant velocity while being scanned with the laser beam, so that scan lines do not overlap on a single plane. The laser beam irradiated onto the photosensitive drum 332 alternatively has light-emission and extinction periods, as described above. Thus, an image is formed as dots on the photosensitive drum 332. Since the laser beam is irradiated so that these dots are formed to slightly overlap each other, an image drawn by continuous lines can be realized.

When the laser beam reaches the scan start position every time it has scanned one surface of the polygonal mirror 324, it is reflected by a mirror 328, is then reflected by a mirror 329, and is detected by a photodetector 330, thus detecting the arrival at the scan start position.

When the photodetector 330 detects that the laser beam has reached the scan start position, it notifies the sequence controller 402 of it. A horizontal sync signal generation circuit 403 adjusts the output timing of the video signal 405 to the semiconductor laser control circuit 1 on the basis of a notification supplied from the photodetector 330 to the sequence controller 402 every time the laser beam has scanned one surface of the polygonal mirror 324. Furthermore, in synchronism with the output timing of the video signal 405, a scanner motor driver 333 controls the rotation of the motor 325. Although not shown in FIG. 7, a latent image formed on the photosensitive drum 332 can be visualized by a known image generation means.

The semiconductor laser control circuit 1 can realize high-speed response characteristics while preventing light-emission delays of the semiconductor laser, as described above. This can contribute to improving the scan speed of the laser beam to be irradiated onto the photosensitive drum 332 and improving the print speed.

In a conventional apparatus, the light amount is adjusted by a sampling operation before the beginning of scanning. In this case, however, the load on the sequence controller increases, resulting in high cost. In contrast to this, according to the embodiment of the present invention, the semiconductor laser control circuit 1 can attain a high-precision light amount setting operation during scanning. For this reason, print nonuniformity can be prevented and a high resolution can be attained without imposing any load on the sequence controller 402. In addition, this can contribute to a cost reduction.

Figure 8:
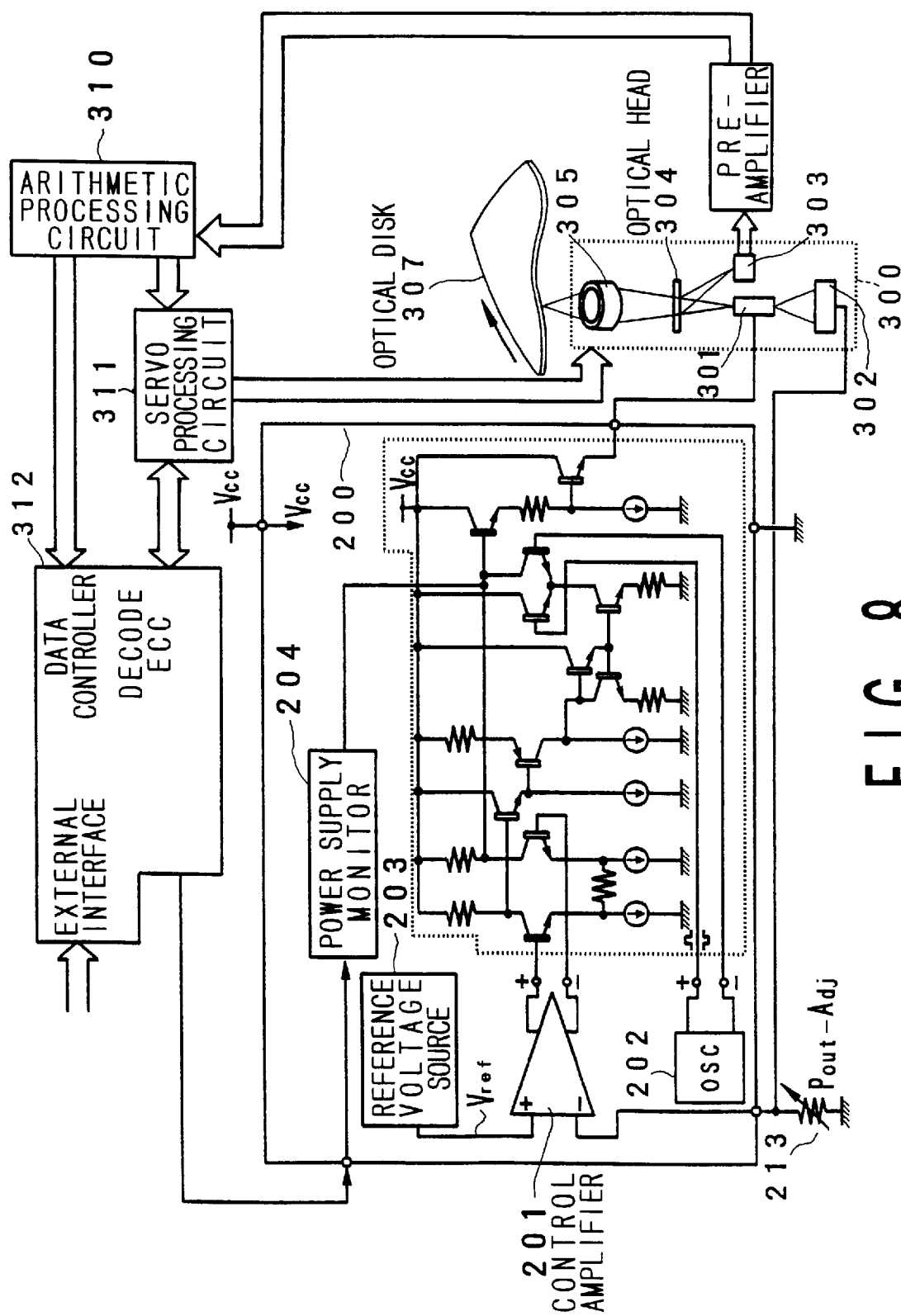
FIG. 8 is a circuit diagram showing the arrangement of an optical disk apparatus according to the seventh embodiment of the present invention.

FIG. 8 shows the arrangement of an optical disk apparatus according to the seventh embodiment of the present invention. The apparatus of this embodiment includes a semiconductor laser device 200 according to the fourth embodiment shown in FIG. 4, and also comprises an optical head 300 including a semiconductor laser 301, a photodetector 302, a hologram element 304, and an objective lens 305, an optical disk 307, a pre-amplifier 308, an arithmetic processing circuit 310, a servo processing circuit 311, and a data controller 312.

The semiconductor laser device 200 drives the semiconductor laser 301 included in the optical head 300 by a high-frequency current of about 100%, e.g., a driving current falling within the range from 100 to 400 MHz, thus suppressing generation of laser noise. Output light from the rear surface side of the semiconductor laser 301 is received by the photodetector 302, and the average output light amount is controlled to be constant, so that the difference between the voltage generated by a rheostat 213 and a reference voltage Vref generated by a reference voltage source 203 becomes zero.

Output light from the semiconductor laser 301 is irradiated onto the optical disk 307 via the objective lens 305, and light reflected by the optical disk 307 is split toward a reproduction photodetector 303 via the hologram element 304, thus detecting servo information and data information from the optical disk 307. Thus, the optical head 300 can be linearly moved in the radial direction of the optical disk 307.

A photodetection signal is output from the reproduction photodetector 303, and is current-voltage converted into a voltage signal by the pre-amplifier 308. The voltage signal is transferred to the arithmetic processing circuit 310. The arithmetic processing circuit 310 separates the voltage signal into a reproduction information signal and a servo signal, and outputs these signals. The servo signal is supplied to the servo processing circuit 311, and the reproduction information signal is output to the data controller 312. The servo processing circuit 311 controls the optical head 300 on the basis of the servo signal. The data controller 312 includes a demodulation circuit and an error correction circuit for processing the reproduction information signal, and also includes controllers for the servo processing circuit 311 and the semiconductor laser device 200, an external interface, and the like.

According to the optical disk apparatus of this embodiment with the above-mentioned arrangement, since the driving operation of the semiconductor laser 301 is controlled by the semiconductor laser device 200, light-emission delays can be prevented, and the high-frequency characteristics can be improved. In addition, low consumption power can be attained.

The above-mentioned embodiments are merely examples, and do not limit the present invention. For example, the circuit arrangement of the semiconductor laser device shown in FIGS. 2, 6, or the like is merely an example, and various modifications may be made. FIG. 7 shows the arrangement of the laser beam printer apparatus as an example of the image recording apparatus of the present invention. However, the present invention is not limited to this specific arrangement, but may be applied to any other apparatuses as long as they drive semiconductor lasers.

As described above, since a semiconductor laser driving circuit of the present invention adjusts the level of a driving signal during the extinction period on the basis of the emission level setting voltage, and supplies the adjusted driving signal to a driving circuit for generating a driving current, the driving signal to be supplied to the driving circuit during the extinction period can be controlled to an optimal level.

In particular, when the level of the driving signal is adjusted, so that a voltage in the vicinity of an operation threshold value voltage is applied across the base-emitter path of a transistor that outputs a driving current, during the extinction period, light-emission delays can be prevented.

When such semiconductor laser driving circuit is applied to the driving operation of a semiconductor laser in an optical disk apparatus using a high-frequency signal, the high-frequency characteristics can be improved and low consumption power can be realized by preventing any light-emission delay.

Furthermore, when the level of the driving signal during the light-emission period is held using a sample-hold circuit, the driving current to be supplied to the semiconductor laser during the extinction period is controlled to become substantially "0", and the driving circuit for outputting a driving current is controlled not to be completely turned off, thus controlling the light-emission intensity with high precision, attaining a high extinction ratio, and preventing any light-emission delay.

Moreover, according to an image recording apparatus of the present invention, which uses such semiconductor laser device, a high-quality image can be recorded due to high-precision light-emission intensity control, a high extinction ratio, and high-speed response characteristics of the semiconductor device.

What is claimed is:

1. A semiconductor laser driving circuit comprising:
   an amplifier for receiving an emission level setting voltage, and outputting a first driving signal on the basis of the emission level setting voltage;
   a driving signal generation circuit for receiving a control signal for instructing a light-emission period of a semiconductor laser, and the first driving signal output from said amplifier, and outputting a second driving signal corresponding to a level of the first driving signal in accordance with a light-emission or extinction period;
   a driving circuit for receiving the second driving signal output from said driving signal generation circuit, and generating and outputting a driving current to be supplied to the semiconductor laser; and
   a control circuit for receiving the emission level setting voltage, and adjusting a level of the second driving signal during the extinction period in correspondence with the emission level setting voltage.

2. A circuit according to claim 1, wherein said driving signal generation circuit comprises a switch which is turned off during the light-emission period of the semiconductor laser and is turned on during the extinction period of the semiconductor laser, and a constant current source for generating the second driving signal by extracting a current corresponding to the first driving signal under the control of said control circuit during the extinction period of the semiconductor laser.

3. A semiconductor laser driving circuit comprising:
   a differential amplifier for receiving complementary emission level setting voltages and outputting a first driving signal and an inverted first driving signal, which are complementary signals, on the basis of the emission level setting voltages;

a driving signal generation circuit for receiving the first driving signal output from said amplifier and complementary control signals for instructing a light-emission period of a semiconductor laser, and outputting a second driving signal which has a level substantially equal to a level of the first driving signal during the light-emission period instructed by the control signals and has a level obtained by decreasing the level of the first driving signal during an extinction period;

a driving circuit for receiving the second driving signal output from said driving signal generation circuit and generating and outputting a driving current to be supplied to the semiconductor laser; and a control circuit for receiving the emission level setting voltage or the inverted first driving signal output from said amplifier and controlling the level of the first driving signal to be decreased by said driving signal generation circuit during the extinction period on the basis of the emission level setting voltage or the inverted first driving signal so as to form the second driving signal of decreased level during each extinction period.

4. A circuit according to claim 3, wherein said differential amplifier comprises a series circuit of a first resistor, a first transistor, and a first constant current source, which circuit is connected between a power supply voltage terminal and a ground terminal, and another series circuit of a second resistor, a second transistor, and a second constant current source, which circuit is connected in parallel with the former series circuit and between said power supply voltage terminal and said ground terminal, bases of said first and second transistors respectively receive the complementary emission level setting voltages, emitters of said first and second transistors are connected via a resistor, the first driving signal based on the emission level setting voltage is output from one terminal of said second transistor, and the inverted first driving signal complementary to the first driving signal is output from one terminal of said first transistor, said driving signal generation circuit comprises a series circuit of a third transistor and a third constant current source connected between said power supply voltage terminal and said ground terminal, and a fourth transistor connected between said one terminal of said second transistor and a connection node between said third transistor and said third constant current source, bases of said third and fourth transistors respectively receive the complementary control signals for instructing the light-emission period of the semiconductor laser, one terminal of said fourth transistor receives the first driving signal output from said second transistor, and the second driving signal having a level equal to the level of the first driving signal during the light-emission period is output from said one terminal of said fourth transistor, said driving circuit comprises a fifth transistor, two terminals of which are connected between said power supply voltage terminal and an output terminal, and a base of which receives the second driving signal output from said driving signal generation circuit, and an output-stage transistor for outputting the driving current to be supplied to the semiconductor laser on the basis of a signal output from one terminal of said fifth transistor, and said control circuit comprises a series circuit of a resistor, a sixth transistor, and a fourth constant current source, which circuit is connected between said power supply voltage terminal and said ground terminal, and a current-voltage conversion circuit which is connected between said power supply voltage terminal and said ground terminal, an input terminal of which is connected to a connection node between said sixth transistor and said fourth constant current source, and an output terminal of which is connected to a control terminal of said third constant current source, a base of said sixth transistor receives the emission level setting voltage or the inverted first driving signal, and said current-voltage conversion circuit outputs a signal for controlling a current amount of said third constant current source during the extinction period.

5. A circuit according to claim 4, wherein said control circuit adjusts the level of the second driving signal so that a voltage substantially equal to an operation threshold value voltage is applied across a base-emitter path of said output-stage transistor included in said driving circuit.

6. A circuit according to any one of claims 1 to 3, wherein said control circuit adjusts the level of the second driving signal so that a voltage substantially equal to an operation threshold value voltage is applied across a base-emitter path of an output-stage transistor included in said driving circuit.

* * * * *